US00RE41220E

(19) United States
(12) Reissued Patent
Davis Jr. et al.

(10) Patent Number: US RE41,220 E
(45) **Date of Reissued Patent: *Apr. 13, 2010**

(54) EXTREME ULTRAVIOLET SOFT X-RAY PROJECTION LITHOGRAPHIC METHOD SYSTEM AND LITHOGRAPHIC ELEMENTS

(75) Inventors: Claude L. Davis Jr., Painted Post, NY (US); Kenneth E. Hrdina, Horseheads, NY (US)

(73) Assignee: Corning Incorporated, Corning, NY (US)

( * ) Notice: This patent is subject to a terminal disclaimer.

(21) Appl. No.: 11/880,425

(22) PCT Filed: Jul. 10, 2000

(86) PCT No.: PCT/US01/18798

§ 371 (c)(1),
(2), (4) Date: Jan. 22, 2002

(87) PCT Pub. No.: WO01/08163

PCT Pub. Date: Feb. 1, 2001

Related U.S. Patent Documents

Reissue of:
(64) Patent No.: 6,931,097
Issued: Aug. 16, 2005
Appl. No.: 10/048,138
Filed: Jan. 22, 2002

U.S. Applications:
(60) Provisional application No. 60/158,813, filed on Oct. 12, 1999, provisional application No. 60/149,840, filed on Aug. 19, 1999, and provisional application No. 60/145,057, filed on Jul. 22, 1999.

(51) Int. Cl.
*G21K 1/06* (2006.01)

(52) U.S. Cl. ..... 378/84; 378/85; 378/37

(58) Field of Classification Search ..... 378/35, 378/34, 84, 85, 37; 430/5, 296, 322, 323, 430/324; 250/492.21, 492.22, 492.24, 493.1, 250/504 R; 359/359

See application file for complete search history.

(56) References Cited

U.S. PATENT DOCUMENTS

| | | | |
|---|---|---|---|
| 2,272,342 | A | 2/1942 | Hyde |
| 2,326,059 | A | 8/1943 | Nordberg |
| 3,713,728 | A | 1/1973 | Austin et al. |
| 3,790,654 | A | 2/1974 | Bagley |

(Continued)

FOREIGN PATENT DOCUMENTS

| | | | |
|---|---|---|---|
| EP | 0349925 | A1 | 1/1990 |
| EP | 1106582 | A2 | 6/2001 |
| WO | WO 00/03400 | A1 | 1/2000 |
| WO | WO 00/48952 | A1 | 8/2000 |
| WO | WO 01/07967 | A1 | 2/2001 |
| WO | WO 01/08163 | A1 | 2/2001 |
| WO | WO 01/75522 | A1 | 10/2001 |

OTHER PUBLICATIONS

Isimoto Co., Ltd., Products for Opitcs, May 17, 1999, http:// www.isimoto.ocm/isimoto/english/variation3.html, pp. 1–2.
Isimoto Co., Ltd., Product Information, May 17, 1999, http://www.isimoto.ocm/isimoto/english/product info.html, pp. 1–4.

(Continued)

*Primary Examiner*—Irakli Kiknadze
(74) *Attorney, Agent, or Firm*—Nixon Peabody LLP

(57) ABSTRACT

The projection lithographic method for producing integrated circuits and forming patterns with extremely small feature dimensions includes an illumination sub-system (36) for producing and directing an extreme ultraviolet soft x-ray radiation λ from an extreme ultraviolet soft x-ray source (38); a mask stage (22) illuminated by the extreme ultraviolet soft x-ray radiation λ produced by illumination stage and the mask stage (22) includes a pattern when illuminated by radiation λ. A protection sub-system includes reflective multilayer coated Ti doped high purity SiO2 glass defect free surface (32) and printed media subject wafer which has a radiation sensitive surface.

49 Claims, 12 Drawing Sheets

U.S. PATENT DOCUMENTS

| | | | | |
|---|---|---|---|---|
| 4,002,512 | A | 1/1977 | Lim | |
| 4,184,078 | A | 1/1980 | Nagel et al. | |
| 4,501,602 | A | 2/1985 | Miller et al. | |
| 4,732,838 | A | 3/1988 | Sechi et al. | |
| 4,902,216 | A | 2/1990 | Cunningham et al. | |
| 4,911,513 | A | 3/1990 | Valette | |
| 5,043,002 | A | 8/1991 | Dobbins et al. | |
| 5,076,700 | A | 12/1991 | DeCaprio | |
| 5,146,518 | A | 9/1992 | Mak et al. | |
| 5,152,819 | A | 10/1992 | Blackwell et al. | |
| 5,154,744 | A | 10/1992 | Blackwell et al. | |
| 5,220,590 | A | 6/1993 | Bruning et al. | |
| 5,315,629 | A | 5/1994 | Jewell et al. | |
| 5,332,702 | A | 7/1994 | Sempolinski et al. | |
| 5,353,322 | A | 10/1994 | Bruning et al. | |
| 5,395,413 | A | 3/1995 | Sempolinski et al. | |
| 5,395,738 | A | 3/1995 | Brandes et al. | |
| 5,454,021 | A | 9/1995 | Nakajima et al. | |
| 5,485,497 | A | 1/1996 | Oizumi et al. | |
| 5,485,499 | A | 1/1996 | Pew et al. | |
| 5,528,654 | A | 6/1996 | Niibe et al. | |
| 5,553,110 | A | 9/1996 | Sentoku et al. | |
| 5,565,030 | A | 10/1996 | Kado et al. | |
| 5,605,490 | A | 2/1997 | Laffey et al. | |
| 5,686,728 | A | 11/1997 | Shafer | |
| 5,868,605 | A | 2/1999 | Cesna | |
| 5,970,751 | A | 10/1999 | Maxon et al. | |
| 5,989,776 | A | 11/1999 | Felter et al. | |
| 5,999,254 | A | 12/1999 | Seibert et al. | |
| 6,176,588 | B1 | 1/2001 | Davis, Jr. et al. | |
| 6,188,150 | B1 | 2/2001 | Spence | |
| 6,199,991 | B1 | 3/2001 | Braat | |
| 6,280,294 | B1 | 8/2001 | Miyamoto | |
| 6,299,318 | B1 | 10/2001 | Braat | |
| 6,312,317 | B1 | 11/2001 | Oguma | |
| 6,366,640 | B1 * | 4/2002 | Shoki | 378/35 |
| 6,465,272 | B1 * | 10/2002 | Davis et al. | 438/72 |
| 6,576,380 | B2 * | 6/2003 | Davis et al. | 430/5 |
| 6,931,097 | B1 * | 8/2005 | Davis et al. | 378/84 |
| 2001/0028462 | A1 | 10/2001 | Ichihara et al. | |

OTHER PUBLICATIONS

Isimoto Co., Ltd. Purity and Chemical Reactivity, May 17, 1999, http://www.isimoto.ocm/isimoto/english/feature1.html, pp. 1–3.

The Optics Mall—Equipment/Supplies, Universal Photonics, Inc., Jul. 7, 1999, p. 1.

Rodel Authored Papers: A Study of the Variation of Physical Properties in Random Lots of Urethane Polishing Pads for CMP, Jul. 7, 1999, http://www.rodel.com/publications/paper1.asp, pp. 1–4.

Rodel Publications Content, Rodel Authored Papers, Jul. 7, 1999, http://www.rodel.com/publications/content.asp, pp. 1–2.

Rodel Publications, Jul. 7, 1999, http://www.rodel.com/publications/default.asp, p. 1.

Cab–O–Sil Web Site, Jul. 7, 1999, http://www.cabot–corp.com/cabosil, pp. 1–3.

Optics and Photonics News, Aug. 1999, vol. 10, No. 8, Aug. 1999, pp. 34–38.

Gianoulakis et al., *Thermal management of EUV lithography masks using low expansion glass substrates*, Proceedings of the SPIE—The International Society for Optical Engineering (1999), vol. 3676, pt. 1–2, p.598–605.

O.V. Mazurin, V.K. Leko and L.A. Komarova, Journal of Non–Crystalline Solids 18 (1975) 1–9, Crystallization of Silica and Titanium Oxide–Silica Corning Glasses (Codes 7940 and 7971), pp. 1–9.

S.T. Gulati and H.E. Hagy, Journal of the American Ceramic Society, vol. 61, No. 5–6 May–Jun. 1978, Theory of the Narrow Sandwich Seal pp. 260–263.

H.E. Hagy and W.D. Shirkey, Determining absolute thermal expansion of titanica–silica glasses: a refined ultrasonic method, Sep. 1975, vol. 14, No. 9, Applied Optics, pp. 2099–2103.

S.F. Jacobs et al., Surface figure changes due to thermal cycling hystersis, Applied Optics, vol. 26, No. 20, Oct. 15, 1987, pp. 4438–4442.

C.W. Gwyn, R. Stulen, D. Sweeney and D. Attwood, Extreme Ultraviolet Lithography, pp. 1–9 and 1–6.

Richard H. Stulen and Donald W. Sweeney, Extreme Ultraviolet Lithography, IEEE Journal of Quantum Electronics, vol. 35, No. 5, May 1999, pp. 694–699.

William M. Tong, John S. Taylor, Stephen P. Vernon, Substrates Requirements For Extreme Ultraviolet Lithography, Lawrence Livermore National Laboratory (LLNL) (abstract only).

EUV Lithography NGL Technology Review, Jun. 9, 1999.

U.S. App. No. 09/943,466, filed Aug. 30, 2001, Ackerman et al.

U.S. Appl. No. 09/943,445, filed Aug. 30, 2001, Bowden et al.

U.S. Appl. No. 09/943,252, filed Aug. 30, 2001, Best et al.

U.S. Appl. No. 09/676,721, filed Sep. 28, 2000, Yu.

U.S. Appl. No. 09/506,162, filed Feb. 17, 2000, Hrdina et al.

*Rapid Prototyping* (Nov. 5, 2001); http://mtiac.iitri.org/pubs/rp/rpl.htm.

*3D Systems: Leftnav* (Nov. 5, 2001); http://www.3dsystems.com/products/slssystems/vanguard/index.asp?promo=.

*ULE: Zero Expansion Glass* (Oct. 31, 2001); http://www.corning.com/semiconductormaterials/products services/ule.asp.

Properties of Corning's Glass and Ceramic Families, pp. 1–23, 1979.

P.C. Shultz et al., Ultra–Low–Expansion Glasses and Their Structure in the $SiO_2$ and $TiO_2$ System, presented to the Third International Conference on the Physics of Non–crystalline Solids, Sheffield University, Sep. 1970.

"Industrial Applications of Silica," Beall, G.H., *Reviews in Minerology*, vol. 29, pp. 469–505.

*HPFS Flyers*: Standard Grade, ArF Grade and KrF Grade, May 1999.

"Ultra–low–expansion glasses and their structure in the $SiO_2$–$TiO_2$ Systems," Schultz et al., *Amorphous Materials*, Sep. 1970, pp. 453–461.

"Extreme Ultraviolet Lithography," Gwyn et al., *EUV LLC*, Nov. 1999, pp. 97–141.

Tanya E. Jewell, Four–Mirror Ring–Field System for EUV Projection Lithography, 1994, pp. 98–102.

High Purity Quartz Glass Products, May 17, 1999, http://www.toshiba–ceramics.com/quartz.html, pp. 1–2.

Shin–Etsu Chemical Homepage, Semiconductor Materials Division, May 17, 1999, http://www.shinetsu.co.jp/english/profile/division/sem–div/sem–div.html, pp. 1–2,

* cited by examiner

EXTREME ULTRAVIOLET SOFT X-RAY PROJECTION LITHOGRAPHIC METHOD SYSTEM AND LITHOGRAPHIC ELEMENTS

Matter enclosed in heavy brackets [ ] appears in the original patent but forms no part of this reissue specification; matter printed in italics indicates the additions made by reissue.

CROSS-REFERENCE TO RELATED PATENT APPLICATIONS

This application claims the benefit of U.S. Provisional Application Ser. No. 60/145,057, filed Jul. 22, 1999 entitled Extreme Ultraviolet Soft X-Ray Projection Lithographic Method and Mask Devices of Claude L. Davis, Robert Sabia and Harrie J. Stevens, and U.S. Provisional Application Ser. No. 60/149,840, filed Aug. 19, 1999 entitled Extreme Ultraviolet Soft X-Ray Projection Lithographic Method and Mask Devices of Claude L. Davis, Robert Sabia, Harrie J. Stevens and Kenneth E. Hrdina, and U.S. Provisional Application Ser. No. 60/158,813, filed Oct. 12, 1999 entitled Extreme Ultraviolet Soft X-Ray Projection Lithographic Method and Mask Devices of Claude L. Davis and Kenneth E. Hrdina.

BACKGROUND OF THE INVENTION

1. Field of the Invention

The present invention relates generally to project lithographic methods and systems for producing integrated circuits and forming patterns with extremely small feature dimensions. The present invention relates particularly to extreme ultraviolet soft x-ray based lithography and radiation manipulating lithography elements which reflectively operate on and manipulate extreme ultraviolet soft x-ray radiation to illuminate, project, and reduce pattern images that are utilized to form circuit patterns. The present invention relates to lithography elements and their use for reflecting extreme ultraviolet soft x-ray photons to enable the use of extreme ultraviolet soft x-ray radiation for lithography that surpasses current optical lithography circuit feature dimension performance.

2. Technical Background

The use of extreme ultraviolet soft x-ray radiation provides beneath in terms of achieving smaller feature dimensions but due to the nature of the radiation, it presents difficulties in terms of manipulating and directing such wavelengths of radiation and has delayed the commercial manufacturing use of such radiation. Current optical lithography systems used in the manufacturing of integrated circuits have progressed towards shorter optical wavelengths of light, such as from 248 nm to 192 nm to 157 nm, but the commercial use and adoption of extreme ultraviolet soft x-rays has been hindered. Part of this slow progression to very short wavelengths of radiation such as in the 15 nm range, has been due to the lack of economically manufacturable mirror elements that can withstand the exposure to such radiation while maintaining a stable and high quality circuit pattern image. For the benefits of extreme ultraviolet soft x-rays to be utilized in the manufacturing of integrated circuits, there is a need for stable high quality glass lithography elements, that preferably allow for direct deposition of reflective coatings to the surface of the glass substrate body.

U.S. Pat. No. 5,956,192 describes a four mirror EUV projection system with lithography mirror elements including two convex mirror elements and two concave mirror elements. U.S. Pat. No. 5,353,322 describes a three mirror x-ray projection lens system with lithography mirror elements including a convex mirror and two concave mirrors. As noted from U.S. Pat. No. 5,698,113, current extreme ultraviolet soft x-ray lithographic systems are extremely expensive. U.S. Pat. No. 5,698,113 tries to address such high costs by trying to recover the surface of multilayer coated substrates by etching the multilayer reflective coatings from substrate surfaces of fused silica and ZERODUR type aluminosilicate crystalline glass-ceramics, even though such etching degrades the substrate surface. "Extreme Ultraviolet Lithography" by Richard Stulen and Donald Sweeney, Optics and Photonics News, August 1999, Vol. 10, No. 8, disclose an EUV reflective coating on a Si substrate (FIG. 3).

The present invention provides for economically manufactured lithography element substrates that are stable, ready and receptive to receiving multilayer reflective coatings and provide an improved extreme ultraviolet soft x-ray based projection lithography method/system. The present invention provides a stable high performance lithography element with the reflective multilayer coating directly deposited on the finished glass surface, and avoids costly and cumbersome intermediate layers between the glass substrate surface and the reflective multilayer coating.

SUMMARY OF THE INVENTION

One aspect of the present invention is a projection lithographic method/system for producing integrated circuits with printed feature dimensions less than 100 nm, preferably ≦70 nm, and most preferably ≦50 nm, that includes providing an illumination sub-system for producing and directing an extreme ultraviolet soft x-ray radiation λ from an extreme ultraviolet soft x-ray source. The method further includes providing a mask stage and a mask illuminated by the extreme ultraviolet soft x-ray radiation λ produced by the illumination sub-system for forming a projected mask pattern when illuminated by radiation λ. The method further includes providing a projection sub-system, a wafer stage and an integrated circuit wafer which has a radiation sensitive wafer surface wherein the projection sub-system projects the projected mask pattern from the mask onto the radiation sensitive wafer surface. Providing the sub-systems includes providing reflective lithography elements. Providing reflective lithography elements includes providing reflective multilayer coated Ti doped high purity $SiO_2$ glass lithography elements. More preferably providing reflective lithography elements includes providing Ti doped high purity $SiO_2$ glass projection substrates with defect free surfaces with figure and finish that are free of surface figure measurements >0.25 nm rms. Preferably the substrate surfaces have radiation manipulating surface shaped profiles, such as curved surfaces and shapes, preferably concave or convex which manipulate and operate on the radiation such that the mask pattern is projected and reduced. Preferably the substrate surfaces have surface figures are less than 0.25 nm rms, have mid-spatial frequency roughness ≦0.20 nm rms, and high-spatial frequency roughness ≦0.10 nm rms.

In another aspect, the present invention includes a method of making a projection lithographic system and a method of projection lithography that includes providing an illumination sub-system which has an extreme ultraviolet soft x-ray source and providing a mask stage that has a reflective mask Ti doped high purity $SiO_2$ glass mask wafer with an unetched glass mask surface coated with a reflective multilayer coating. The method further includes providing a projection reduction sub-system including a plurality of Ti doped high purity $SiO_2$ glass reflective lithography elements, providing a wafer stage with a radiation sensitive semiconductor wafer; and aligning the illumination sub-system, the mask stage, the projection reduction sub-system, and the wafer stage wherein the extreme ultraviolet soft x-ray source illuminates the mask stage with extreme ultraviolet soft x-ray radiation and forms a circuit printing pattern which is projected, and focussed by the projection reduction sub-system onto said radiation sensitive wafer.

The invention further includes a method of making a reflective extreme ultraviolet soft x-ray lithography element which includes the steps of: providing a Ti doped high purity $SiO_2$ non-crystalline glass substrate free of inclusions and having a shaped element surface with surface figure features <0.25 nm rms, mid-spatial frequency roughness <0.20 nm rms, and high-spatial frequency roughness <0.10 nm rms, and coating the shaped element glass surface with a reflective multilayer coating with uniform multilayer period thickness controlled to at least 0.1% rms to form a uniform reflective coating having a reflectivity of at least 65% to extreme ultraviolet soft x-rays.

The invention also includes a reflective extreme ultraviolet soft x-ray lithography element that comprises a Ti doped high purity $SiO_2$ inclusion-free glass having an unetched polished radiation manipulating shaped surface, with the surface free of printable surface figures.

The invention further includes a method of making a reflective extreme ultraviolet soft x-ray lithography element that has the steps of: providing a high purity Si containing feedstock and a high purity Ti containing feedstock, delivering the high purity Si containing feedstock and the high purity Ti containing feedstock to a conversion site, converting the Si containing feedstock and the Ti containing feedstock into Ti doped $SiO_2$ soot, consolidating the Ti doped $SiO_2$ soot into an inclusion fee homogeneous Ti doped high purity $SiO_2$ glass, forming the glass into a Ti doped high purity $SiO_2$ glass preform, forming the preform into a shaped surface lithography element substrate, measuring the figure and finish of the substrate surface, and coating the substrate surface with an extreme ultraviolet soft x-ray reflective coating.

Additional features and advantage of the invention will be set forth in the detailed description which follows, and in part will be readily apparent to those skilled in the art from that description or recognized by practicing the invention as described herein, including the detailed description which follows, the claims, as well as the appended Figures.

It is to be understood that both the foregoing general description and the following detailed description are merely exemplary of the invention, and are intended to provide an overview or framework for understanding the nature and character of the invention as it is claimed. The accompanying Figures are included to provide a further understanding of the invention, and are incorporated in and constitutes a part of this specification. The Figures illustrate various embodiments of the invention, and together with the description serve to explain the principals and operation of the invention.

DETAILED DESCRIPTION OF THE PREFERRED EMBODIMENTS

Figure 1:
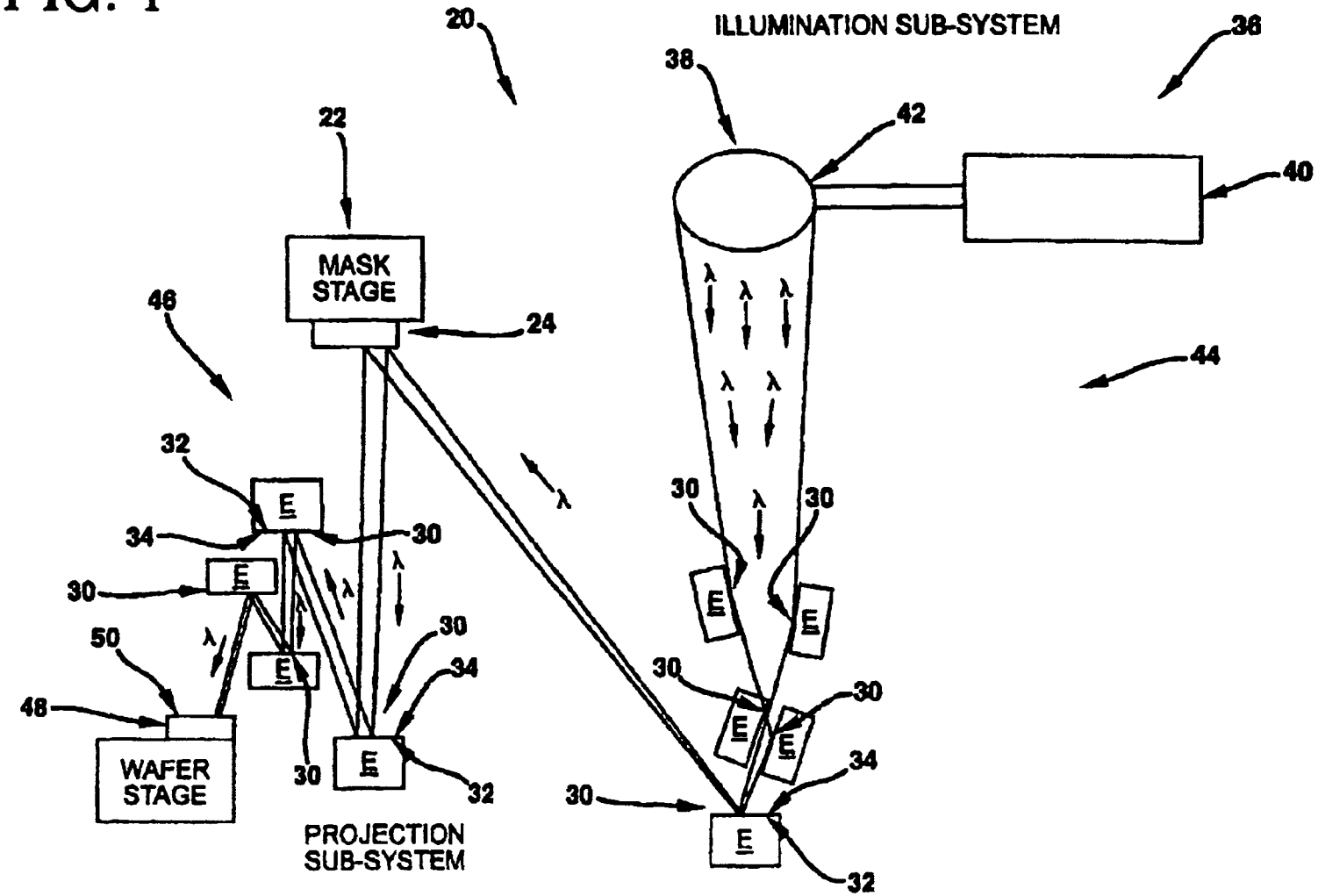
FIG. 1 is a diagrammatic depiction of an embodiment of the invention.

Reference will now be made in detail to the present preferred embodiments of the invention, examples of which are illustrated in the accompanying Figures. An exemplary embodiment of the projection lithographic method/system of the present invention is shown in FIG. 1 and is designated generally throughout by reference numeral 28.

In accordance with the invention, the present invention for a projection lithographic method includes providing a mask stage illuminated by extreme ultraviolet soft x-ray radiation λ produced by an illumination sub-system, with the mask stage including a mask for forming a projected mask pattern when illuminated by radiation λ. The invention includes providing Ti doped high purity $SiO_2$ glass lithography elements which manipulate radiation λ and operate on the projected mask pattern.

Figure 2:
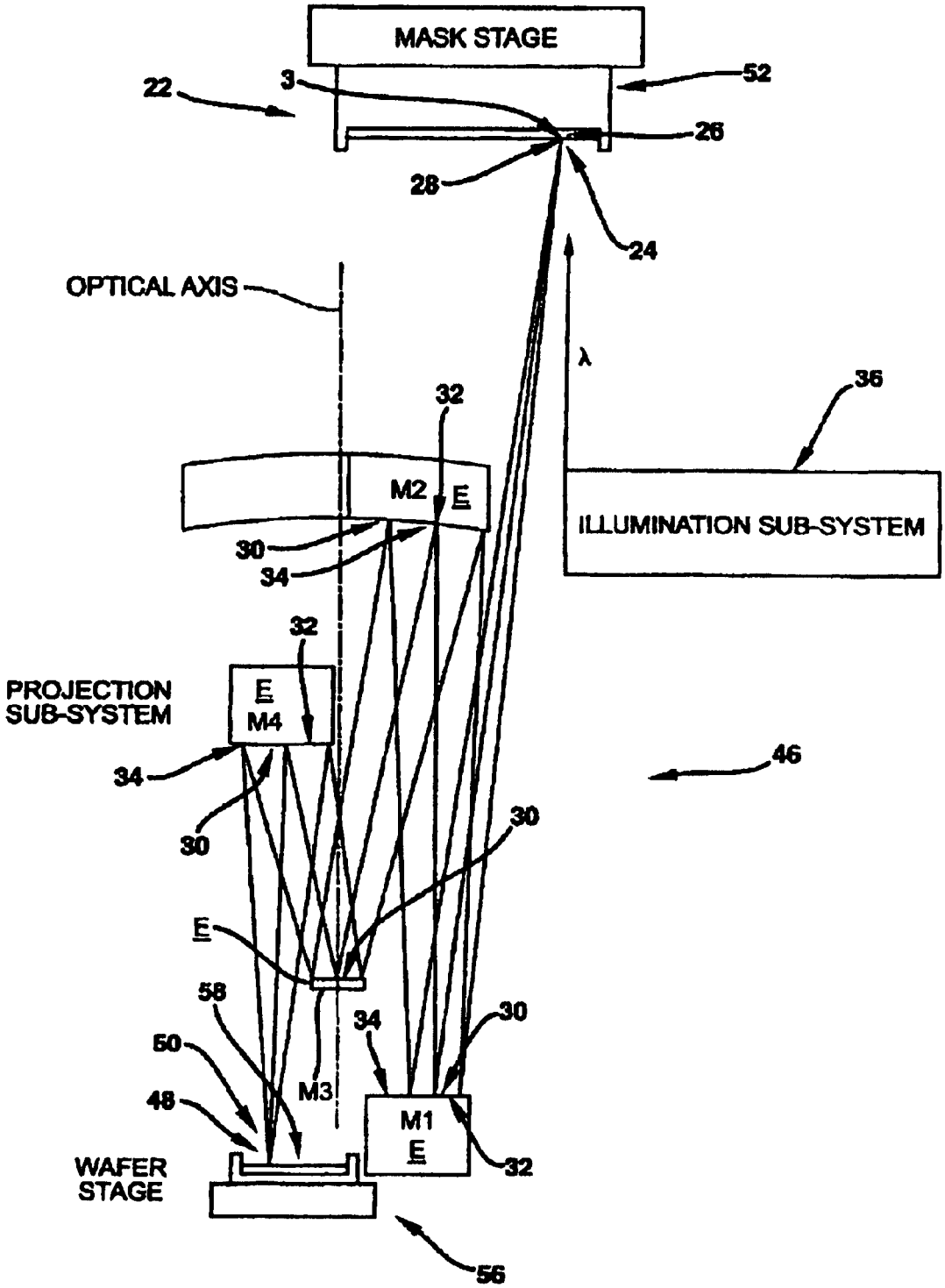
FIG. 2 is a side view of an embodiment of the invention shows optical axis alignment.
Figure 3:
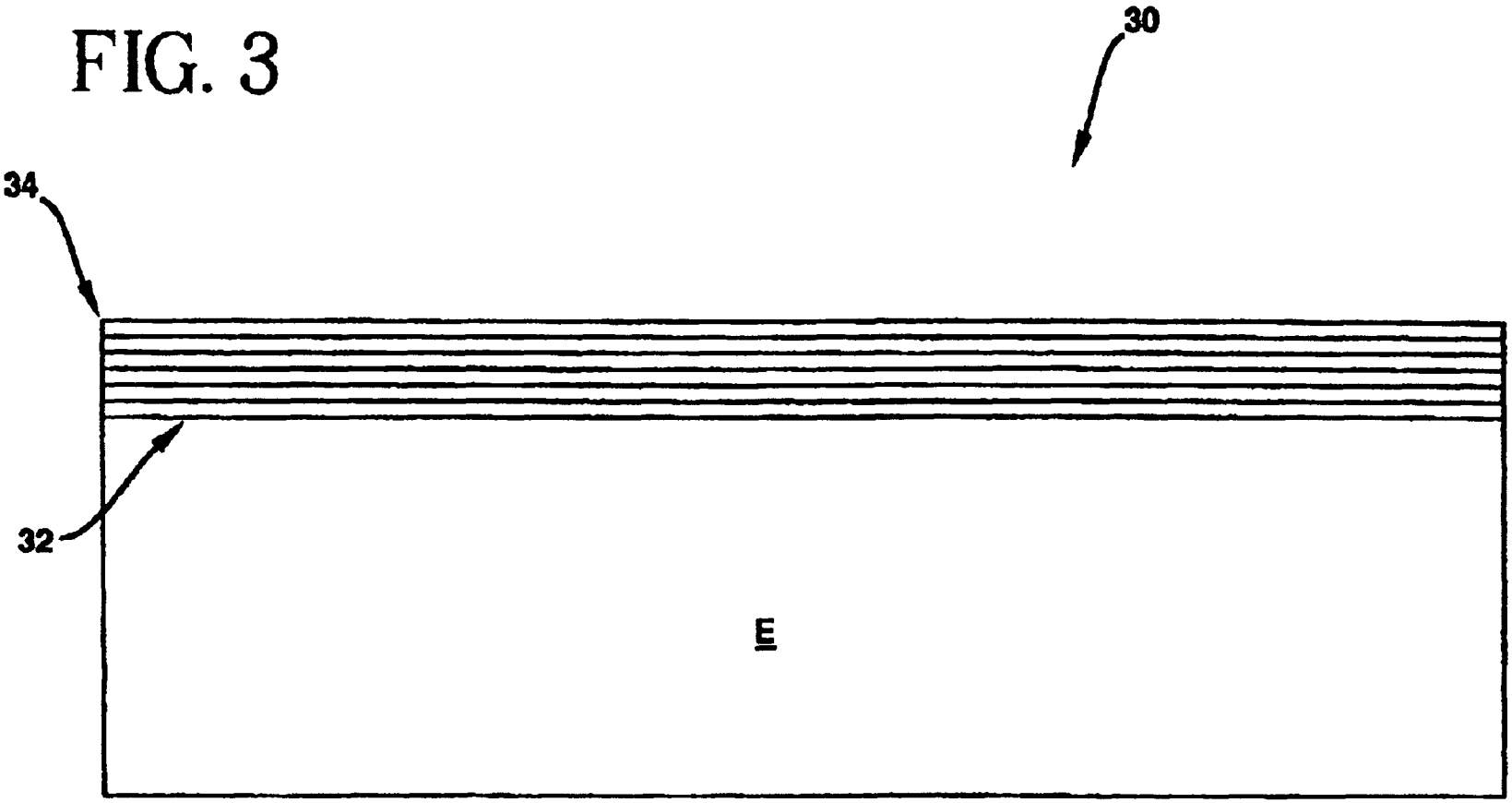
FIG. 3 is a side cross section of an embodiment of the invention.
Figure 4:
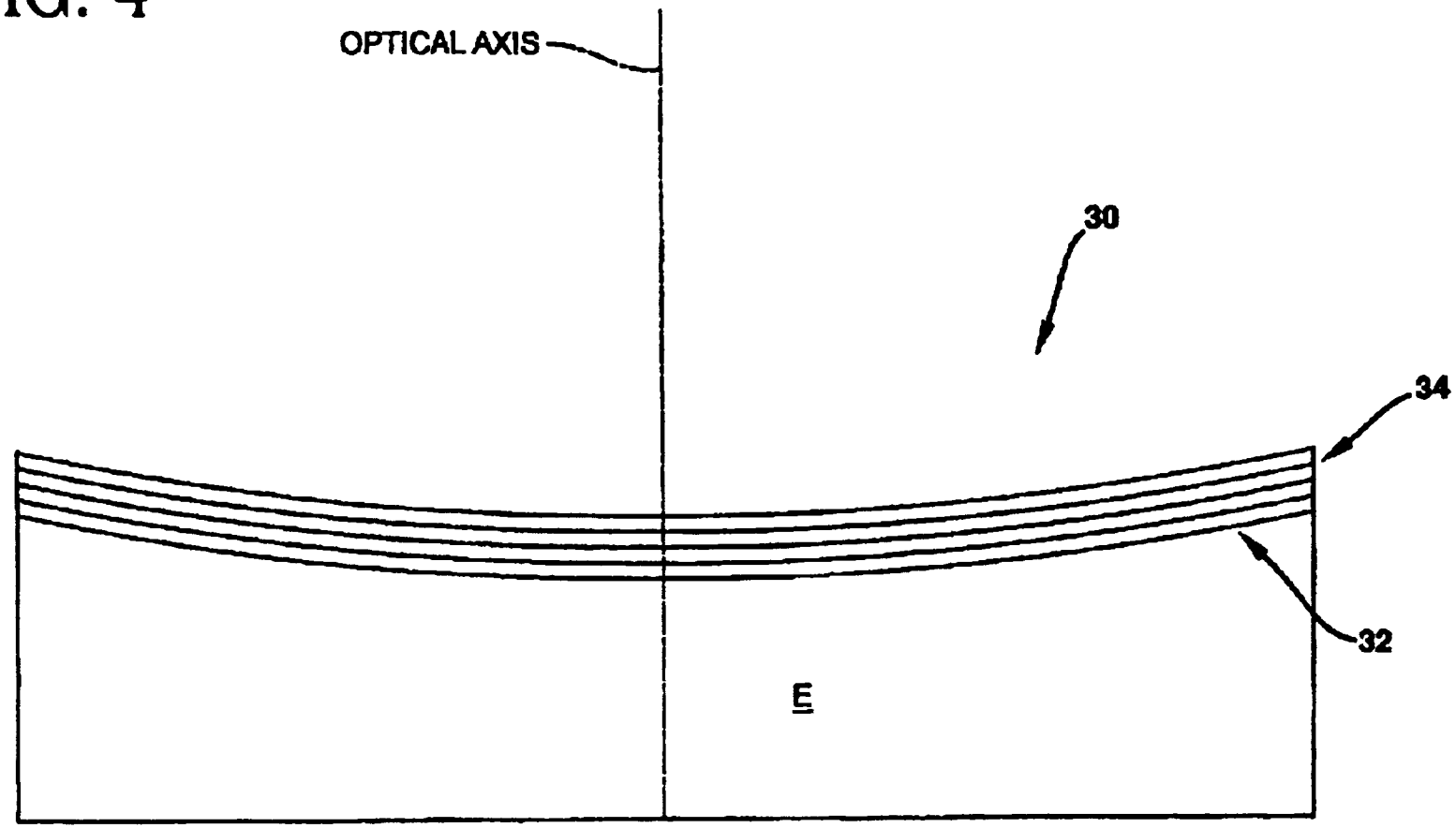
FIG. 4 is a side cross section of an embodiment of the invention.

As embodied herein, and depicted in FIG. 1, projection lithographic method/system 20 comprises mask stage 22 which includes circuit patterned reflective mask 24. As shown in FIG. 1 Ti doped high purity $SiO_2$ glass lithography elements E reflect radiation λ utilizing reflective coated Ti doped high purity $SiO_2$ glass defect free surfaces 30. The reflective coated Ti doped high purity $SiO_2$ glass defect free surfaces include reflective multilayer coating 34 on glass surface 32, with reflective multilayer coatings 34 preferably directing coating and bonding to Ti doped high purity $SiO_2$ glass surface 32. FIG. 2 shows the optical alignment of projection lithographic method/system 20 of FIG. 1. FIG. 3 shows a Ti doped high purity $SiO_2$ glass lithography element E, with reflective coated Ti doped high purity $SiO_2$ glass defect free surface 30 including reflective multilayer coating 34 on glass surface 32. Reflective lithography element E of FIG. 3 is preferably utilized with the invention in the illumination sub-system. FIG. 4 shows a Ti doped high purity $SiO_2$ glass lithography element E with multilayer coating 34 on curved shape glass surface 32. Reflective lithographic element E of FIG. 4 is preferably utilized with the invention in the projection sub-system.

The projection lithographic method for producing integrated circuits with printed feature dimensions less than 100 nm includes providing illumination sub-system 36 for producing and directing extreme ultraviolet soft x-ray radiation λ. Illumination sub-system 36 includes extreme ultraviolet soft x-ray source 38. In a preferred embodiment, illumination sub-system 36 includes a laser produced plasma such as a 1.064 μm neodymium YAG layer 40 which produces a Xenon gas plasma 42 from pulsed gas jet Xe clusters which outputs extreme ultraviolet soft x-ray radiation λ that is directed by condenser 44. Alternatively, extreme ultraviolet soft x-ray illumination sub-system 36 may comprise a synchrotron, discharge pumped x-ray lasers, an electronbeam driven radiation source drive, or a radiation source based on high harmonic generation based on femto-second laser pulses. Preferably the illumination sub-system includes a plurality of Ti doped high purity lithography elements E which direct the source produced radiation λ and form condenser 44. Lithography elements E of condenser 44 form a funneling radiation λ pipe, preferably with the lithography elements having substantially flat reflecting surfaces, preferably situated to form glancing reflective angels with radiation λ emitting from source 38. Ti doped high purity $SiO_2$ lithography elements E may be utilized in a elliptical geometry to collect radiation λ.

The projection lithographic method includes providing mask stage 22 which is illuminated by the extreme ultraviolet of x-ray radiation λ produced by illumination sub-system 36. Providing mask stage 22 includes providing a patterned reflective mask 24 which forms a projected mask pattern when illuminated by the radiation λ. Providing mask 24 preferably includes providing a Ti doped high purity $SiO_2$ glass wafer 26 which has a patterned absorbing overlay 28 overlaying reflective multilayer coated Ti doped high purity $Sio_2$ glass defect free wafer surface 3.

The method includes providing a projection sub-system 46 and an integrated circuit wafer 48 with a radiation sensitive wafer surface 50, wherein projection sub-system 46 projects the projected mask pattern from mask 24 onto radiation sensitive wafer surface 50. Preferably projection sub-system 46 is a series of Ti doped high purity $SiO_2$ glass lithography elements E which reduce the size of the mask pattern and project the reduced pattern image onto wafer surface 50. A preferred embodiment is shown in FIG. 1–2 having four glass lithography elements E.

In a preferred embodiment, extreme ultraviolet soft x-ray radiation λ is in the range from about 5 nm to about 15 nm, and most preferably illumination sub-system 36 directs radiation centered about 13.4 nm to reflective mask 24, with the Ti doped high purity $SiO_2$ glass lithography elements E having a reflectivity of at least 65% at 13.4 nm. With extreme ultraviolet soft x-ray radiation λ centered about 13.4 nm, Ti doped high purity $SiO_2$ glass surfaces 32 are coated with reflective multilayer coating 34 comprising alternating layers of Mo and Si. Alternatively it is preferred that extreme ultraviolet soft x-ray radiation λ is centered about 11.3 nm, with Ti doped high purity $SiO_2$ glass surfaces 32 coated with reflective multilayer coating 34 comprising alternating layers of Mo and Be. With λ centered about 11.3 nm, reflective Ti doped high purity $SiO_2$ glass lithography elements E have a reflectivity of at least 70% a at 11.3 nm. Multilayer coating 34 is preferably comprised of alternating layers of a first element and a second element wherein the coating is highly reflective to the extreme ultraviolet soft x-ray radiation λ.

The provided Ti doped high purity $SiO_2$ glass of lithography elements E is defect free in that the glass body is free of bulk glass defects and is free of inclusion, including glass voids the gas filled voids in the glass, and is particularly free of any such defects or imperfections or structures that have a dimension greater than 80 nm. In a particularly preferred embodiment, glass surface 32 is an unetched glass surface that has been finished such as with polishing, to a surface free of surface figure measurement >0.25 nm rms, and preferably finished to at least 0.15 nm rms roughness. The Ti doped $SiO_2$ glass is substantially non-transmissive to extreme ultraviolet soft x-ray radiation λ and the reflectivity of reflective coated wafer surface 30 and the ultra-low roughness of defect free surface 32 is utilized in the invention to inhibit scattering of radiation λ and provide an ultra-stable high quality image during the projection lithography process. The provided Ti doped high purity $SiO_2$ glass is highly stable, homogeneous, chemical attach resistant, is preferably chlorine-free and preferably has an impurity level of less than 10 ppb of alkali and alkaline earth metals. Preferably the Ti doped high purity $SiO_2$ glass contains from 5 to 10 wt. % $TiO_2$ and has a coefficient of thermal expansion in the range from +30 ppb to −30 ppb at 20° C., and more preferably in the range from +10 ppb to −10 ppb at 20° C. Preferably the $TiO_2$ content is from 6 to 8 wt. %, more preferably form 6.5 to 7.5 wt. %, and most preferably about 7 wt %. Preferably lithography elements E have a variation in coefficient of thermal expansion throughout the glass substrate body that is less than or equal to 15 ppb. The lithography element glass preferably has a thermal conductivity $K \leqq 1.40$ w/(m.° C.) at 25° C., more preferably in the range from 1.25 to 1.38, and most preferably about 1.31. During projection lithography, lithography elements E and mask 24 are heated by the illumination of radiation λ, and even with such irradiation and heating of lithography elements E changes of the patterned circuit projected image are inhibited and the quality of the projected image is maintained. In the inventive method, the Ti doped high purity $SiO_2$ glass is heated to an operating temperature by radiation λ and preferably the glass has an adjusted Ti dopant level adjusted such that the glass has a coefficient of thermal expansion centered about 0 at such operating temperature, preferably with the zero thermal expansion range also including the lithography element manufacturing temperatures and the lithography element non-operating rest temperature. With such a thermal conductivity and coefficient of thermal expansion, the Ti doped high purity $SiO_2$ glass provides appropriate lithographic operation and stability, and provides a highly reliable and economic lithographic method/system in which the lithography elements do not require cooling in addition to economically manufacturable elements. In a preferred embodiment, the lithography elements are not actively cooled and are free of a cooling system such as circulating cooling fluids, thermal electric coolers, or other means for removing heat build up during operation of the lithography system.

The provided Ti doped high purity $SiO_2$ glass defect free surface 32 are free of surface figure measurements >0.25 nm rms. Finishing methods including chemical mechanical polishing are beneficially accepted by the non-crystalline glass. With shaped surface mirror lithography elements, an appropriately shaped and sized curve is generated in the non-crystalling glass body substrate and finished. The defect free glass surface of lithography elements E preferably have a surface figure no greater than 0.25 nm rms, and a high-spatial frequency roughness (at frequencies above 1 $\mu m^{-1}$) no greater than 0.10 nm nms. The reflective multilayer coated Ti doped high purity $SiO_2$ glass surface 30 preferably reflects at least 65%, and more preferably reflects at least 70%, of the radiation λ illuminating the reflective multilayer coating. In a preferred embodiment surface 32 is unetched and free of an intermediate barrier layer or release layer so that multilayer reflective coating 34 is directly bonded thereto.

The invention further comprises a method of making a projection lithographic system and the method of projecting lithographic patterns that includes providing an illumination sub-system 36 with an extreme ultraviolet soft x-ray source 38 and providing a mask stage 22 with a mask receiving member 52 and a reflective mask Ti doped high purity $SiO_2$ glass mask wafer 24 with an unetched glass mask wafer surface coated with a reflective multilayer coating having a reflectivity of at least 65% to extreme ultraviolet soft x-rays received in mask receiving member 52. The method further includes providing a projection reduction sub-system 46 with a plurality of Ti doped high purity $SiO_2$ glass lithography elements E; providing wafer stage 56 with a radiation sensitive semi-conductor wafer 58; and aligning illumination sub-system 36, mask stage 22, projection sub-system 46, and wafer stage 56 such that extreme ultraviolet soft x-ray source 38 illuminates reflective mask 24 with extreme ultraviolet soft x-ray radiation and reflective mask 24 reflects the radiation and forms a printing pattern of which is projected, reduced and focused onto radiation sensitive print media 58. The method includes providing a reflective mask 24 with a Ti doped high purity $SiO_2$ glass mask wafer 26 free of inclusions and wafer surface defects that are printable on radiation sensitive print media 58.

Figure 8:
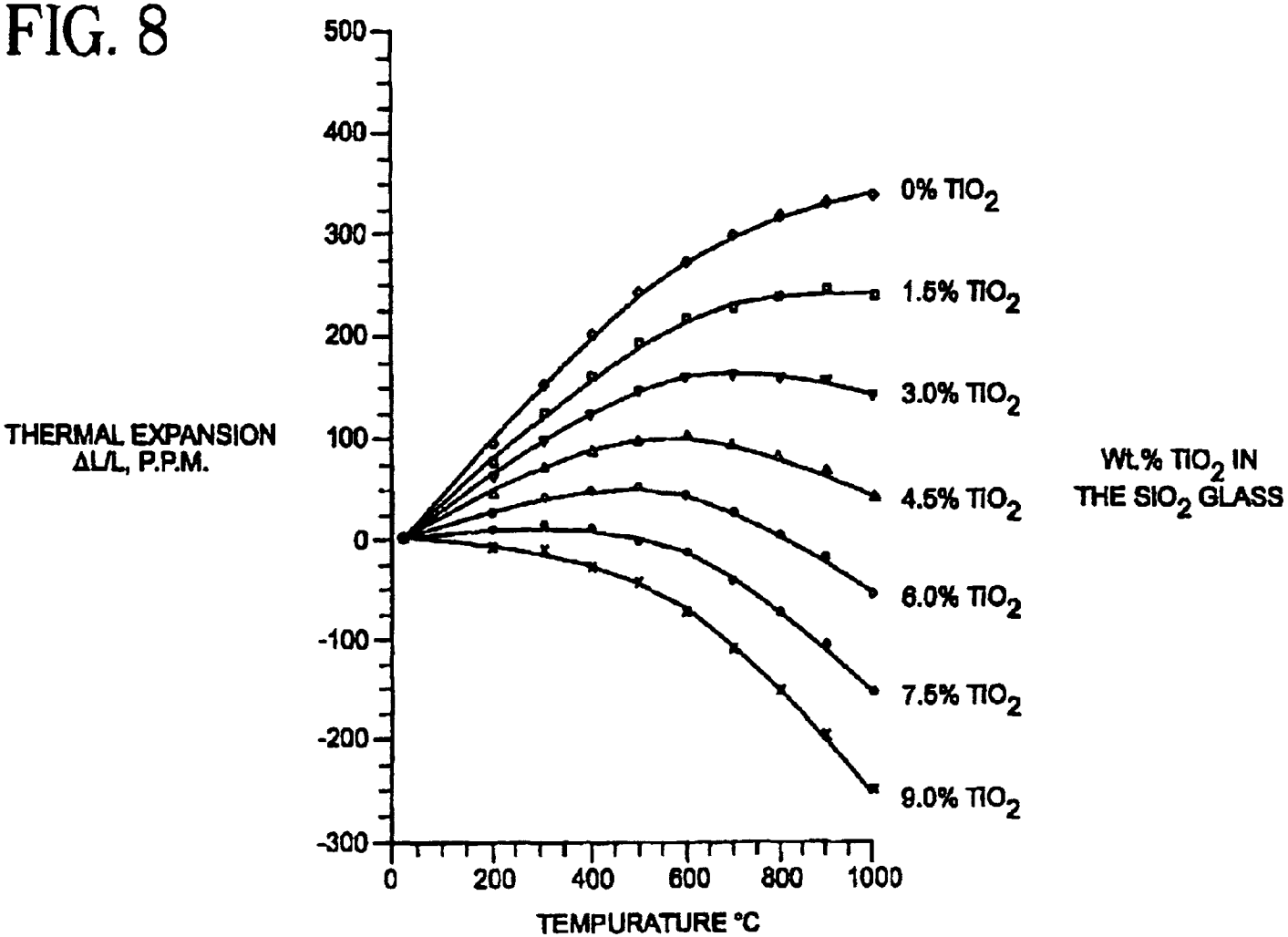
FIG. 8 a plot of Thermal Expansion (y-axis) versus Temperature (x-axis) for various wt. % $TiO_2$ levels in $SiO_2$ glass.

The method preferably includes determining operating temperatures of lithography elements when illuminated by radiation $\lambda$ during operation of system 20 and providing a lithography elements E includes providing Ti doped high purity $SiO_2$ glass having a coefficient of thermal expansion at the determined operating temperature centered about 0. Such turning of the coefficient of thermal expansion is done by controlled turning of Ti dopant content in the $SiO_2$ glass as demonstrated by FIG. 8 which shows the thermal expansion characteristics for high purity $SiO_2$ glasses with $TiO_2$ wt. % from 0 to 9.0 wt. % $TiO_2$.

In a further embodiment of the method the Ti dopant high purity $SiO_2$ glass is heated to a raised temperature range by the extreme ultraviolet soft x-ray radiation and the Ti doped high purity $SiO_2$ glass has a coefficient of thermal expansion for the raised temperature range that is less than 10 ppb and greater than −10 ppb. Preferably the method includes providing a Ti doped high purity $SiO_2$ glass that is a thermal insulator (low thermal conductivity) with a thermal conductivity $K \leqq 1.40$ w/(m.° C.), preferably in the range from 1.25 to 1.38, most preferably about 1.31, and allowing the glass to heat up without actively cooling the glass and reflective elements E.

The invention further comprises a method of making a reflective extreme ultraviolet soft x-ray projection lithography element that includes providing a Ti doped high purity $SiO_2$ non-crystalline substrate free of inclusions and having a shaped element surface with surface figure features <0.25 nm rms, mid-spatial frequency roughness <0.20 nm rms, and high-spatial frequency roughness <0.10 nm rms, and coating the element glass surface with a reflective multilayer coating 34 with a uniform multilayer period thickness controlled to at least 0.1% rms to form a uniform reflective surface 30 having a reflectivity of at least 65% to extreme ultraviolet soft x-rays. The method further includes generating a curved surface 30. Coating with a reflective multilayer coating preferably includes forming alternating smooth thin layers (≦4 nm thick) of a first element and a second element, such as Mo/Si or Mo/Be.

The alternating layers provide a soft x-ray extreme ultraviolet reflectivity peak, preferably centered about 13.4 nm and alternatively centered about 11.3 nm. Such an alternating multilayer reflective coating functions similarly to a quarter wave stack, with the thickness of the layers optimized for constructive interference of the photons reflected at each interface and minimal absorption so a large number of interfaces contribute to the high reflectance of the coating. Preferably layer to layer variation in thickness is within 0.01 nm with the multilayer coating 34 controlled in thickness to about 0.1% rms across lithography element surface 32, preferably a uniformity better than 0.01% so that surface shape 32 is maintained. In a preferred embodiment, the coating is alternating layers of Mo and Si with Mo thickness about 2.8 nm and the Si thickness about 4.0 nm. With proper deposition conditions, reflectances of 68% or greater at 13.4 nm are achievable with such alternating layers. The alternating layers of Mo and Si are preferably capped with a capping layer to prevent oxidation of the Mo on exposure to normal atmospheres, with a preferred capping layer being a Si layer.

In the preferred embodiment, the reflective multilayer coating is directly deposited onto the Ti doped high purity $SiO_2$ glass surface. The finished surface and the Ti doped high purity $SiO_2$ glass properties provide for directly depositing and bonding between the glass surface and the reflective mutlilayer coating without the need for additional treatments of a substrate surface such as smoothing coating processes used with glass-ceramic crystalline containing substrate materials and remove the need for intermediate layers between the glass surface and the reflective mutlilayer coating. A superior and stable reflective lithography element is achieved with the direct bonding contact between the finished Ti doped high purity $SiO_2$ glass surface and the multilayer reflective coating.

Figure 6:
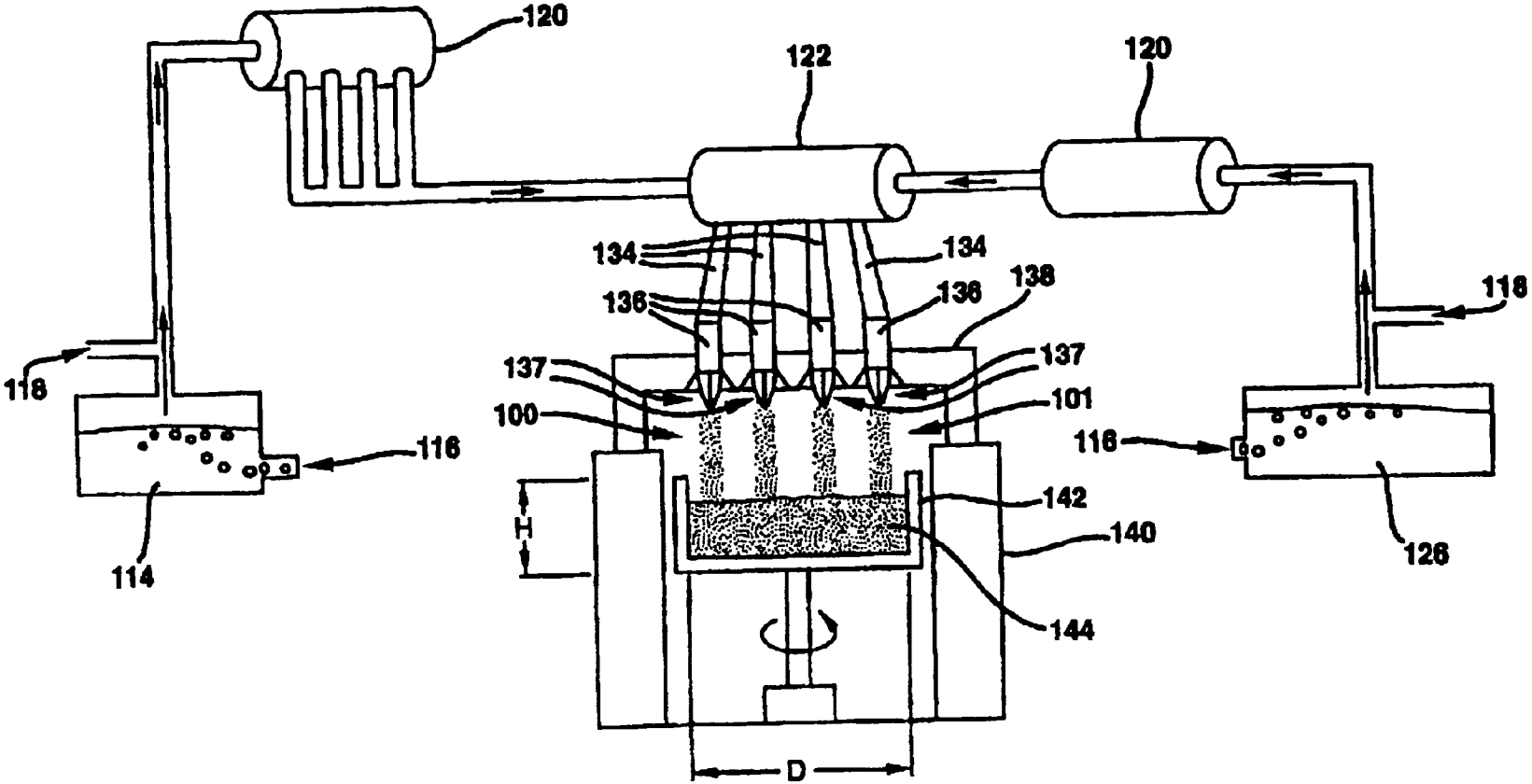
FIG. 6 a diagrammatic depiction of an embodiment of the invention.

Preferably providing a Ti doped high purity $SiO_2$ glass preform as shown in FIG. 6, includes providing a high purity Si containing feedstock 114 and a high purity Ti containing feedstock 126, delivering high purity Si containing feedstock 114 and high purity Ti containing feedstocks 126 to a conversion site 100, converting the delivered feedstocks into Ti doped $SiO_2$ soot 101, depositing soot 101 in a revolving zircon collection cup 142 of refractory zircon furnace 140 onto the upper glass surface of hot Ti doped high purity $SiO_2$ glass body 144, concurrently with the soot deposition consolidating the Ti doped $SiO_2$ soot into an inclusion free homogeneous Ti doped high purity $SiO_2$ glass body 144 and forming glass body 144 into a Ti doped high purity $SiO_2$ glass preform. Preferably providing high purity Si containing feedstock 114 and high purity Ti containing feedstock 126 includes providing chlorine-free high purity Si containing feedstock and providing a chlorine-free high purity Ti containing feedstock, converting the chlorine-free feedstocks into a chlorine-free Ti doped $SiO_2$ soot and consolidating the soot into a chlorine-free Ti doped $SiO_2$ glass. Preferably the Si feedstock is a silioxane, preferably a polymethylsiloxane, more preferably a polymethylcyclosiloxane, and most preferably high purity octamethylcyclotetrasiloxane (Si feedstock comprised of at least 99% octamethylcyclotetrasiloxane). Preferably the Ti feedstock is a titanium alkoxide, and more preferably titanium isopropoxide [$Ti(OPri)_4$], preferably with Ti feedstock comprised of at least 99% titanium isopropoxide. A nitrogen inert carrier gas 116 is bubbled through feedstocks 114 and 126, and a nitrogen inert carrier gas 118 is added to the Si feedstock vapor/carrier gas mixture and the Ti feedstock vapor/carrier gas mixture to prevent saturation and facilitate delivery of the feedstocks to conversion site 100, through distribution systems 120 and manifold 122. Preferably the Si feedstock is mixed with the Ti feedstock in manifold 122 to form a homogeneous gaseous Ti doped $SiO_2$ glass precursor mixture which is delivered through conduits 134 to conversion site burners 136 mounted in the upper portion 138 of furnace 140 which produce conversion site burner flames 137, so that the feedstock mixture is converted into Ti doped $SiO_2$ soot 101 and then homogeneous Ti doped $SiO_2$ glass 144. The weight percent dopant content of $TiO_2$ in the $SiO_2$ glass can be adjusted by changing the amount of Ti feedstock delivered to conversion site 100 that is incorporated into soot 101 and glass 144. In a preferred method the Ti dopant weight percent level of glass 144 and substrate there-from is adjusted so that the substrate has a coefficient of thermal expansion centered about 0 at an operating temperature of the reflective lithography elements. In accordance with FIG. 8, adjustments to the wt. % $TiO_2$ in the high purity $SiO_2$ glass adjust the thermal expansion characteristics of the resultant glass. Preferably the Ti dopant weight percent level of the glass is adjusted within the range from about 6 wt. % $TiO_2$ to about 9 wt. %, most preferably in the range from 7 to 8 wt. %. Conversion site burner flames 137 are formed with a fuel/oxygen mixture (Natural Gas and/or $H_2$/with $O_2$) which combusts, oxidized and converts the feedstocks at temperatures ≧ about 1600° C. into soot 101 and consolidates the soot into glass 144. The temperatures of conduits 134 and the feedstocks contained therein are preferably controlled and monitored to inhibit reactions prior to flames 137 which may disrupt the flow of the feedstocks and soot 101 and complicate the manufacturing process of glass 144. Preferably furnace 140 and particularly zircon cup 142 and upper portion 138 are made form high purity zircon refractory bricks which are free of alkali and alkaline earth metals, and other impurities which tend to migrate from the furnace and contaminate glass 144. Such high purity bricks can be obtained using high purity ingredients and calcining the bricks to leach out impurities.

Preferably cup 142 has a circular diameter shape of at least 0.5 meters, more preferably at least 1 meter, most preferably a diameter of about 1.5 meters so that glass body 144 is a cylindrical boule having a respective diameter of at least 0.5 meters, preferably 1 meter, most preferably 1.5 meters, and a height of at least 8 cm, preferably at least 10 cm, preferably about 15 cm thick, with a preferred height in the range from 12 to 16 cm. Forming glass body 144 into a Ti doped high purity $SiO_2$ glass substrate, preferably includes inspecting glass body 144 for any glass defects, such as inclusions, if defect found selecting defect free sections of glass body 144 such as defect free section 62 of glass body 144 shown in FIG. 7A, and removing the defect free section 62 from 144 as shown in FIG. 7B. Substrates are then formed from removed defect free section 62 as shown in FIG. 7C. Preform 60 is preferably obtained by core drilling section 62 from body 144, and then a curve is generated and finished to provide lithography element E in FIG. 7C.

Figure 7A:
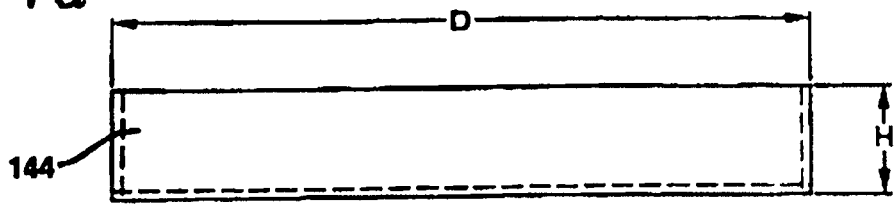
FIGS. 7a–7c and 7A–7C are manufacturing flow depictions of embodiments of the invention.
Figure 7B:
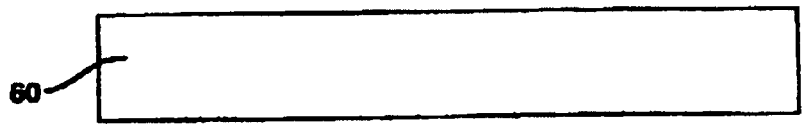
Figure 7C:
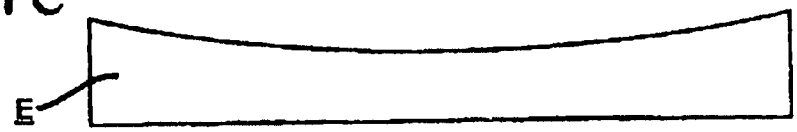
Figure 7A:
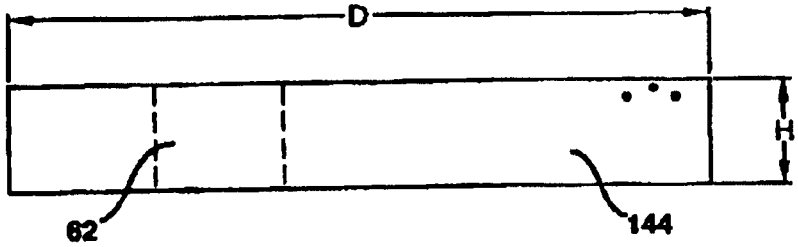
Figure 7B:
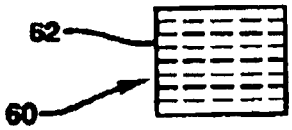
Figure 7C:
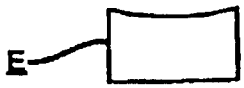

FIG. 7a–7c show a method for making large lithography elements, preferably greater than one meter in the lithography elements largest dimension, which utilizes a majority of boule glass disk 144 formed as shown in FIG. 6. Such large reflective lithography elements are preferred interms of minimizing diffraction effects of radiation λ and provides an improved projected image on the integrated circuit wafer with excellent resolution. Improved projected images are provided by the method, system, lithography elements of the invention with minimizing detrimental diffraction effects by maximizing the size of the reflective lithography elements using Ti doped high purity $SiO_2$ glass. Preferably to maximize the size of the largest lithography element in the system a glass disk 144 is formed that has a diameter D≧1 m, more preferably D≧1.5 m.

Figure 5A:
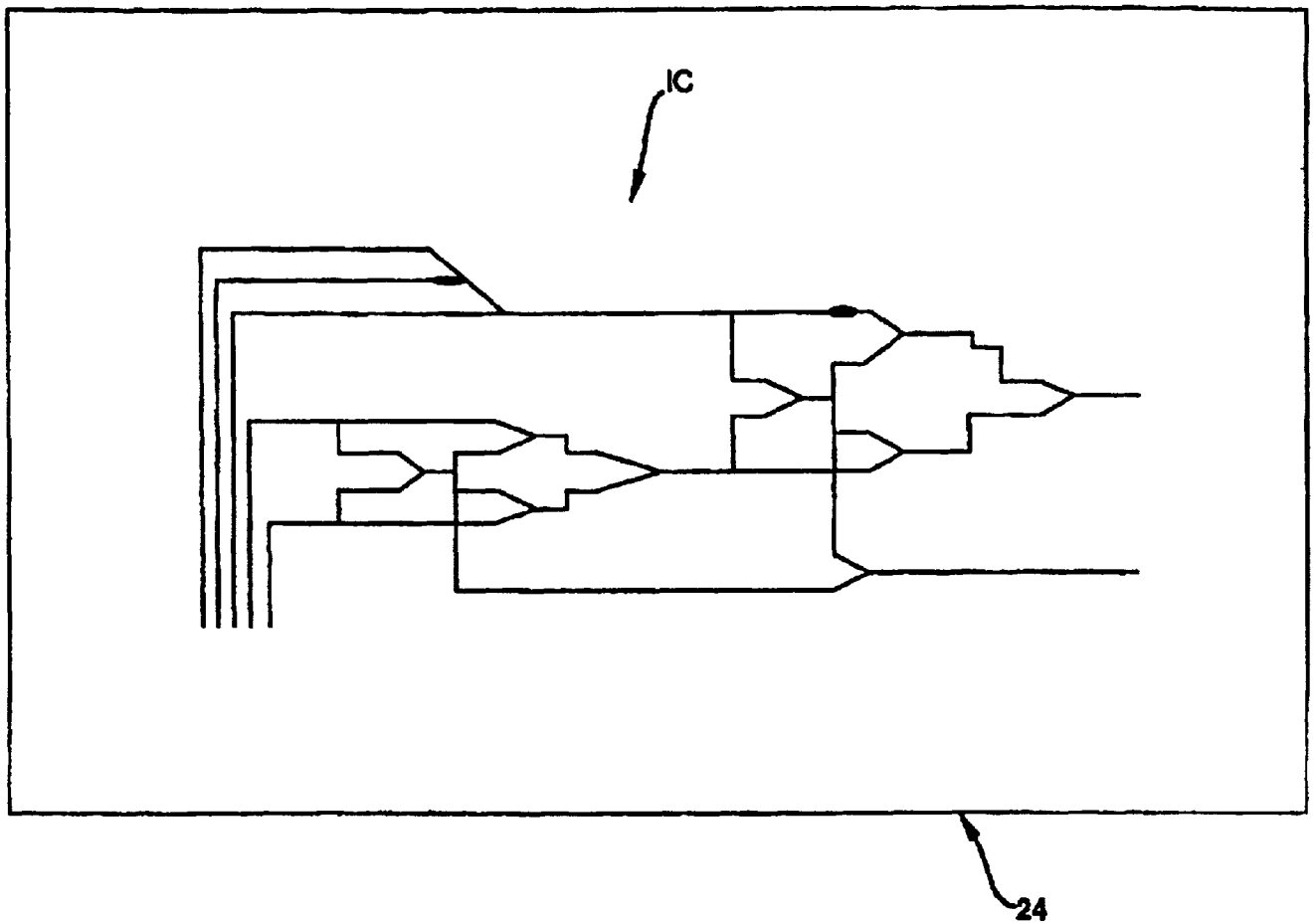
FIG. 5A–5C illustrate a lithographic pattern method of the invention.
Figure 5B:
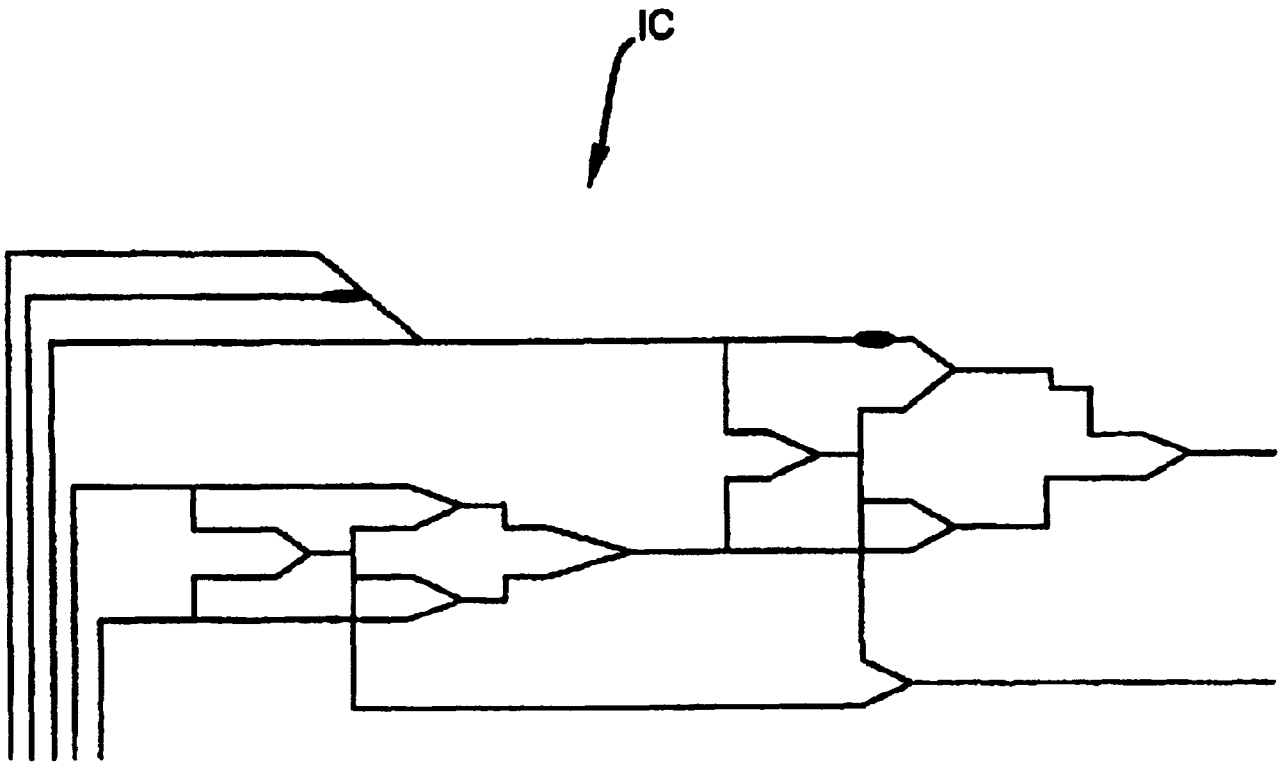
Figure 5C:
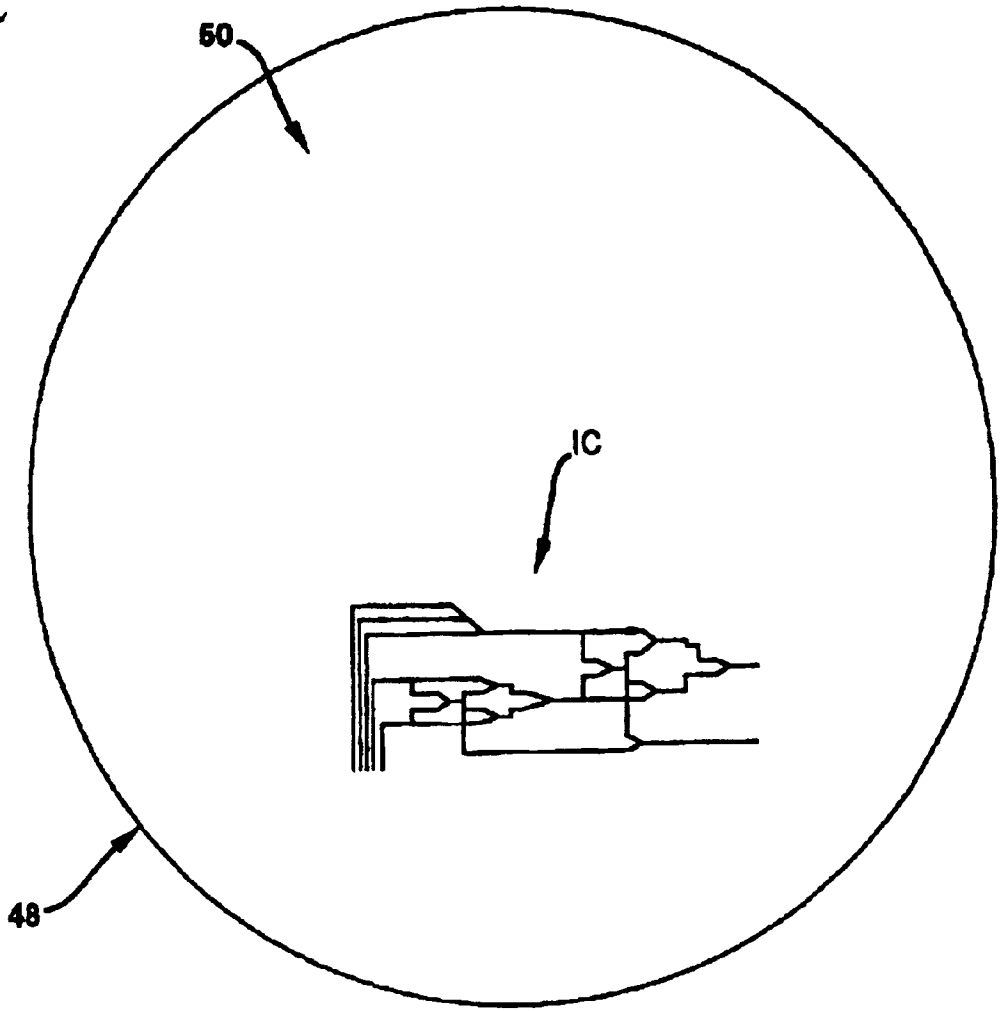

The invention further includes reflective extreme ultraviolet soft x-ray lithography elements. The lithography element E comprises a Ti doped high purity $SiO_2$ inclusion-free glass substrate that preferably is unetched. FIGS. 1–4 show such Ti doped high purity $SiO_2$ inclusion-free glass lithography elements. FIGS. 5A–5C show a lithographic integrated circuit printing pattern 1C. As shown in FIG. 5A lithographic integrated circuit printing pattern IC is on reflective mask 24. Projected lithographic integrated circuit printing pattern IC of FIG. 5B is formed by illuminating the mask of FIG. 5A with extreme ultraviolet soft x-ray radiation λ. Lithographic integrated circuit printing pattern IC of FIG. 5C is formed on wafer surface 50 of wafer 48 from projected pattern IC of FIG. 5B which was produced from the mask pattern IC of FIG. 5A.

The invention also includes a method of making a reflective extreme ultraviolet soft x-ray lithography element that comprises providing a Ti doped high purity $SiO_2$ glass preform 60 free of glass inclusions. Preferably providing a Ti doped high purity $SiO_2$ glass preform includes providing a high purity Si containing feedstocks 114 and high purity Ti containing feedstock 126, delivering feedstocks 114 and 126 to conversion site 100, converting feedstocks 114 and 126 into Ti doped $SiO_2$ soot 101, consolidating soot 101 into an inclusion free homogeneous Ti doped high purity $SiO_2$ glass and forming the glass into a Ti doped high purity $SiO_2$ glass preform 60. Preferably Si feedstocks 114 is chlorine free and Ti feedstock 126 is chlorine free so that soot 101 and glass 144 is chlorine free.

As shown in FIG. 6, cup 142 has a diameter D of at least a half meter, preferably at least about one meter, more preferably a diameter D of at least a one and a half meter, preferably a height depth thickness H of at least 12 cm, preferably at least 20 cm, with glass 14 conforming to these dimensions and shape of cup 142 so that glass body 144 has a diameter D and a depth H, with D>H, preferably with the glass body from which the Ti doped high purity $SiO_2$ glass preform is made is a disk with D≧2H, preferably D≧3H, more preferably D≧4H, and most preferably D≧5H.

In a preferred embodiment such as in FIG. 7A–7C, the preform is formed from the glass body with a largest dimension X, such that diameter D of the glass body is greater than 2×, preferably greater than 3×.

Figure 9:
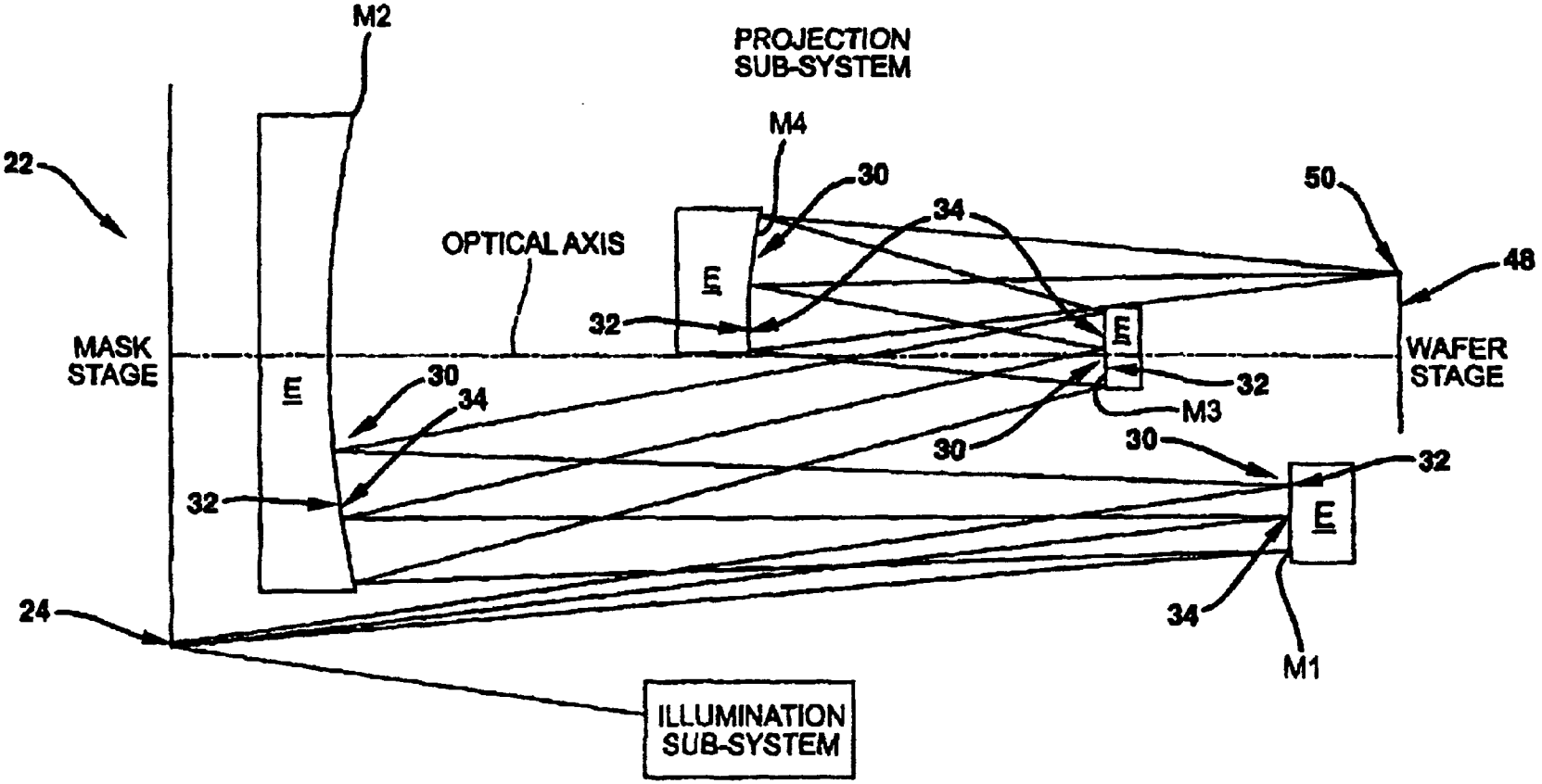
FIG. 9 is a side view of an embodiment of the invention showing optical axis alignment.
Figure 10:
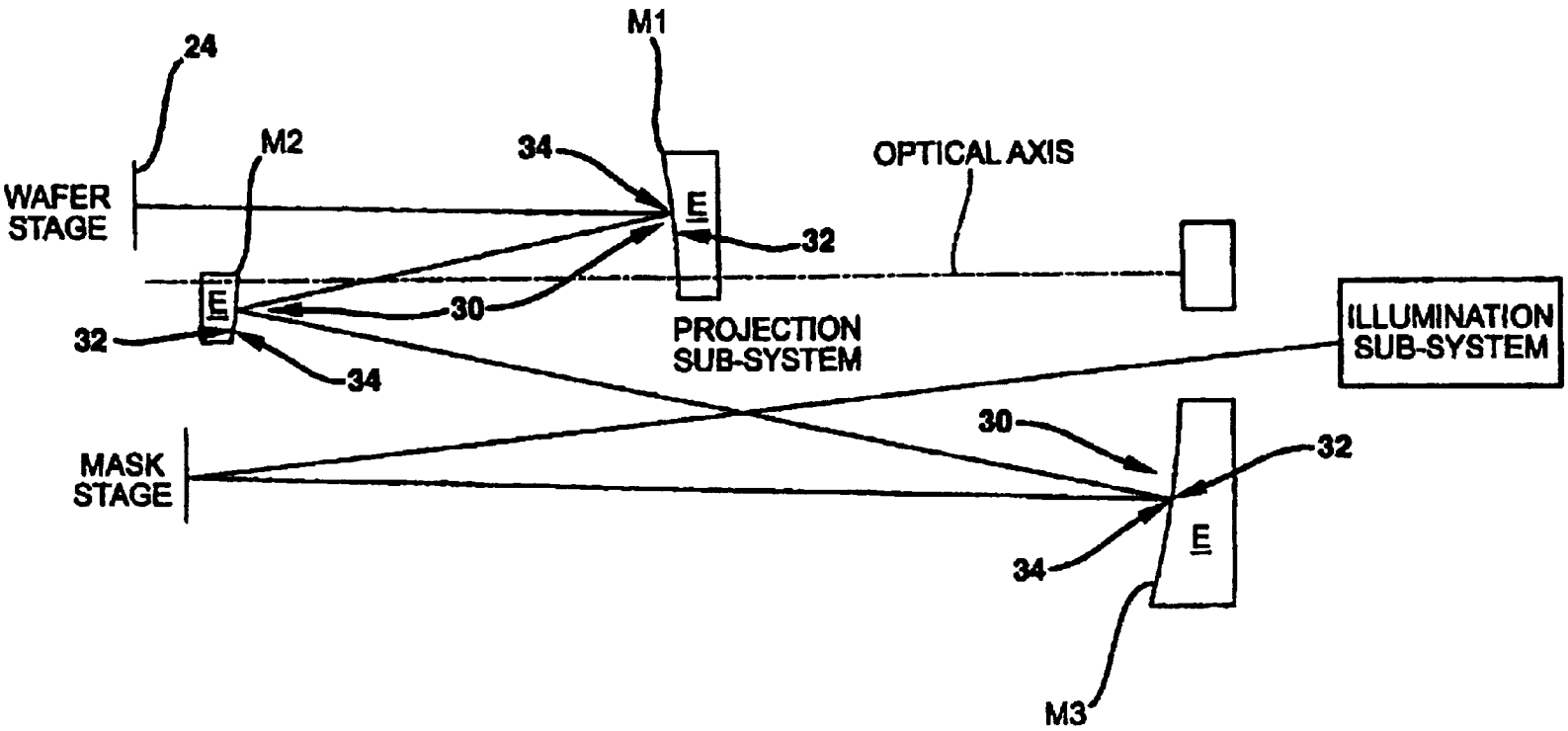
FIG. 10 is a side view of an embodiment of the invention showing optical axis alignment.

FIG. 9 shows an embodiment of the invention with four reflective lithographic elements E, with the projection subsystem including mirror M1, mirror M2, mirror M3, and mirror M4. FIG. 10 shows an embodiment of the invention with three reflective lithographic elements E, with the projection sub-system including mirror M1, mirror M2, and mirror M3.

The finishing steps in addition to polishing the preform surfaces includes cleaning the preform surfaces to remove finishing products to provide a clean smooth surface for contact with the reflective multilayer coating. Preferably the step of providing a preform includes adjusting the Ti dopant weight percent level of the Ti doped high purity $SiO_2$ glass prefrom so that the glass has a coefficient of thermal expansion centered about 0 at an operating temperature of the reflective extreme ultraviolet soft x-ray lithography element.

The inventive method of making a reflective extreme ultraviolet soft x-ray lithography element provides an economic means for efficiently manufacturing large quantities of glass substrate bodies which can enable the utilization of extreme ultraviolet soft x-ray projection lithography for the mass production volume manufacturing of integrated circuits with printed feature dimensions less than 100 nm. Additionally, the inventive method of making a reflective lithography element Ti doped high purity $SiO_2$ glass includes the beneficial steps of inspecting and qualifying the finished glass surface 32 to ensure that the surface has proper figure and finish and is defect free, and additionally inspecting and qualifying the CTE of the glass.

During use of the reflective extreme ultraviolet soft x-ray lithography elements E, the Ti doped $SiO_2$ glass substrate has a lithography operating temperature. The operating temperature of the high purity Ti doped $SiO_2$ glass element include a maximum operating temperature. During the making of the reflective extreme ultraviolet soft x-ray lithography element, the high purity Ti doped $SiO_2$ glass is exposed to manufacturing treatment temperatures. The manufacturing treatment temperatures include elevated temperatures during cutting, machining, finishing, and coating. The manufacturing treatment temperature include a maximum manufacturing temperature. Preferably the high purity Ti doped $SiO_2$ glass is crystallization resistant and has a crystallization temperature $T_{crystal}$ at which crystallization in the glass is induced, with $T_{crystal}$ being substantially greater than the maximum operating temperature and the maximum manufacturing temperature. Preferably $T_{crystal}$ is at least 400° C. higher than the greater of the maximum operating temperature and the maximum manufacturing temperature, more preferably at least 700° C. higher, and most preferably at least 800° C. higher. Preferably $T_{crystal}$ is ≧1300° C., with the maximum operating temperature and maximum manufacturing temperature not exceeding 500° C. With the high purity Ti doped $SiO_2$ glass, the crystallization of the glass is inhibited at the elevated temperatures experienced during manufacturing and use of the lithography elements E. The glass is thus beneficial in that it has a high temperature crystallization behavior.

Additionally, in view of the manufacturing treatment temperatures and the lithography operating temperatures the high purity Ti doped $SiO_2$ glass maintain its physical dimensions when exposed to thermal cycling. In the use and manufacture of the high purity Ti doped $SiO_2$ glass lithography element repeated thermal cycling between lower temperatures and higher temperatures do not substantially change the physical dimensions of the glass substrate. Preferably the high purity Ti doped $SiO_2$ glass is resistant to thermal cycling hysteresis, and most preferably is free of thermal cycling hysteresis when repeatedly cycled (>100 cycles) from the lowest lithography operating temperature to the highest lithography operating temperature. Most preferably physical dimensions of the glass substrate and lithography element do not measurably change when repeatedly cycled from a low temperature to a high temperature that are below 300° C. with the low temperature proximate to 0° C. and the high temperature proximate to 300° C.

In a preferred embodiment, the high purity Ti doped $SiO_2$ glass lithography element has a birefringence resulting from permanent strain in the glass of less than 10 nm/cm, and more preferable is less than 2 nm/cm. Preferably birefringence less than 2 nm/cm is achieved by providing a constant homogeneous distribution of Ti dopant throughout the $SiO_2$ glass with the coefficient of thermal expansion in the range from +10 ppm to −10 ppb at 20° C., with the maximum fluctuation in the coefficient of thermal expansion being less than 10 ppb, most preferably less than 5 ppb. Additionally, low birefringence may be obtained by annealing the high purity Ti doped $SiO_2$ glass. Preferably the high purity Ti doped $SiO_2$ glass lithography element substrate is annealed at a temperature of at least 900° C. more preferably at least 1000° C., and most preferably at least 1030° C., and preferably at a time after the glass has experienced stress from machining.

Ensuring such low birefringence levels is achieved by monitoring the coefficient of thermal expansion of the high purity Ti doped $SiO_2$ glass by transmitting ultrasonic waves through the glass and measuring the transit time of the ultrasonic waves through the glass to determine the ultrasonic velocity and expensivity characteristics of the glass exposed to the ultrasonic waves. Preferably such measurement and monitoring of the high purity Ti doped $SiO_2$ glass is utilized throughout the glass lithography element manufacturing process. Such ultrasonic measurements are preferably utilized for quality control, inspection, and selection. Such measurement are preferably utilized to insure the manufacturing of glass body 144 is providing a constant homogeneous distribution of Ti dopant. Additionally, such measurements are used in inspecting glass body 144 and selecting sections 62 to be cut from glass body 144. Further such measurements may be utilized to insure that undue stresses are not formed in the glass during later manufacturing stages such as finishing and also used as a determining factor if further annealing of the glass is required.

A preform 60 may be obtained by cutting the prefrom from an inclusion free area of a Ti doped high purity $SiO_2$ glass boule disk 144 that had a cylindrical disk shape of approximately 152 cm diameter and about a 20 cm thickness (height). The boule is preferably produced from octamethylcycloetetrasiloxane and titanium isopropoxide feedstocks in accordance with FIG. 6 of the invention with the high purity Ti doped high purity $SiO_2$ glass having a $TiO_2$ wt. % of about 7.5 wt. %.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

We claim:

1. A projection lithographic method for producing integrated circuits with printed feature dimensions less than 100 nm, said method comprising:

providing an illumination sub-system for producing and directing an extreme ultraviolet soft x-ray radiation λ, said illumination sub-system including an extreme ultraviolet soft x-ray source, providing a mask stage and a mask illuminated by said extreme ultraviolet soft x-ray radiation λ produced by said illumination sub-system for forming a projected lithographic pattern when illuminated by said radiation λ, providing a projection sub-system, providing a wafer stage and an integrated circuit wafer, said integrated circuit wafer having a λ radiation sensitive wafer surface, projecting with said projection sub-system the projected lithographic pattern from said mask onto said radiation sensitive wafer surface, said sub-system comprising a plurality of reflective lithography elements, said lithography elements including a plurality of reflective multilayer coated Ti doped high purity $SiO_2$ glass substrates with defect free glass surfaces for manipulating said radiation and aid lithographic pattern.

2. A method as claimed in claim 1 wherein said Ti doped $SiO_2$ glass is inclusion free.

3. A method as claimed in claim 1 wherein said Ti doped $SiO_2$ glass substrate surface is an unetched glass surface.

4. A method as claimed in claim 1 wherein said Ti doped $SiO_2$ glass is substantially non-transmissive to said extreme ultraviolet soft x-ray radiation λ.

5. A method as claimed in claim 1 wherein said Ti doped $SiO_2$ glass substrate contains from 5 to 10 wt. % $TiO_2$ and has a coefficient of thermal expansion in the range from +30 ppb to −30 ppb at 20° C.

6. A method as claimed in claim 5 wherein said coefficient is in the range of +10 ppb to −10 ppb at 20° C.

7. A method as claimed in claim 6 wherein said substrate has a variation in coefficient of thermal expansion ≦15 ppb.

8. A method as claimed in claim 5 wherein said substrate has a variation in coefficient of thermal expansion ≦15 ppb.

9. A method as claimed in claim 5, wherein said Ti doped $SiO_2$ glass is heated to an operating temperature by said radiation λ and said Ti doped $SiO_2$ glass has a Ti dopant level such that said glass has a coefficient of thermal expansion at said operating temperature centered about 0.

10. A method as claimed in claim 1 wherein said substrate has a thermal conductivity K ≦1.40 w/(mx° C.) at 25° C.

11. A method as claimed in claim 1 wherein said Ti doped $SiO_2$ glass substrate is heated by said radiation λ, and said projected lithographic pattern on said integrated circuit wafer is substantially unaffected by said heating of said glass substrate.

12. A method as claimed in claim 1 wherein said reflective multilayer coated Ti doped $SiO_2$ glass lithography element surface reflects at least 65% of the radiation λ illuminating the reflective lithography element.

13. A method as claimed in claim 12 wherein said reflective multilayer coated Ti doped $SiO_2$ glass surface reflects at least 70% of the radiation λ.

14. A method as claimed in claim 12 wherein said reflective multilayer is directly coated on said Ti doped $SiO_2$ glass surface.

15. A method as claimed in claim 1 wherein said reflective lithography elements have a maximum operating temperature and a maximum manufacturing temperature and said Ti doped high purity $SiO_2$ glass has a crystallization temperature $T_{crystal}$ which is greater than said maximum operating temperature and said maximum manufacturing temperature.

16. A method as claimed in claim 15 wherein $T_{crystal}$ is at least 400° C. higher than said maximum operating temperature and said maximum manufacturing temperature.

17. A method as claimed in claim 16 wherein $T_{crystal}$>1100° C.

18. A method as claimed in claim 1 wherein said reflective lithography elements have a lowest lithography operating temperature and a highest lithography operating temperature, said Ti doped high purity $SiO_2$ glass free of thermal cycling hysteresis when repeatedly cycled at least a hundred times from said lowest lithography operating temperature to said highest lithography operating temperature.

19. A method as claimed in claim 1 wherein said Ti doped high purity $SiO_2$ glass has a birefringence less than 10 nm/cm.

20. A method of making a projection lithographic printing pattern, said method comprising:

providing an illumination sub-system including an extreme ultraviolet soft x-ray source, providing a mask stage, said mask stage including a reflective mask Ti doped high purity $SiO_2$ glass mask wafer with a glass mask wafer surface coated with a reflective multilayer coating providing a projection reduction sub-system, said projection reduction sub-system including a plurality of Ti doped high purity $SiO_2$ glass reflective lithography elements, providing a wafer stage, said wafer stage including a radiation sensitive semiconductor wafer, aligning said illumination sub-system, said mask stage, said projection reduction sub-system and said wafer stage wherein said extreme ultraviolet soft x-ray source illuminates said mask with extreme ultraviolet soft x-ray radiation, said reflective mask reflects said radiation and forms a printing pattern which is reduced and projected by said projection reduction sub-system Ti doped high purity $SiO_2$ glass reflective lithography elements onto said semiconductor wafer.

21. A method as claimed in claim 20, wherein providing said illumination sub-system includes providing a plurality of Ti doped high purity $SiO_2$ glass reflective lithography elements which direct and condense said extreme ultraviolet soft x-ray radiation.

22. A method as claimed in claim 21, wherein providing Ti doped high purity $SiO_2$ glass reflection lithography elements includes providing glass surfaces free of surface figure measurements >0.25 nm rms.

23. A method as claimed in claim 20, wherein providing Ti doped high purity $SiO_2$ glass reflective lithography elements includes providing shaped glass surfaces free of surface figure measurements >0.25 nm rms.

24. A method as claimed in claim 20, further comprising, determining an operating temperature of said reflective lithography elements when exposed to said extreme ultraviolet soft x-ray radiation during operation of said method, and providing a reflective lithography elements includes providing lithography elements with Ti doped high purity $SiO_2$ glass having coefficients of thermal expansion at the operating temperatures of the reflective lithography elements that are centered about 0.

25. A method as claimed in claim 20, wherein said Ti doped high purity $SiO_2$ glass is heated to a raised temperature range by said extreme ultraviolet soft x-ray radiation and said Ti doped high purity $SiO_2$ glass has a coefficient of thermal expansion for said raised temperature range that is less than 10 ppb and greater than −10 ppb.

26. A method as claimed in claim 25 wherein said glass has a variation in coefficient of thermal expansion ≦10 ppb.

27. A method as claimed in claim 20 wherein said Ti doped high purity $SiO_2$ glass has a thermal conductivity K ≦1.40 w/(mx° C.) at 25° C.

28. A method of making a reflective extreme ultraviolet soft x-ray lithography element said method comprising:

providing a Ti doped high purity $SiO_2$ glass substrate free of inclusions and having a shaped element glass surface with surface figure features <0.25 nm rms, mid-spatial frequency roughness <0.20 nm rms, and high spatial frequency roughness <0.10 rms, coating said shaped element glass surface with a reflective multilayer coating with uniform multilayer period thickness controlled to at least 0.1% rms, to form a uniform reflective coating having a reflectivity of at least 65% to extreme ultraviolet soft x-rays.

29. A method as claimed in claim 28, wherein said lithography element is heated to a raised temperature range by extreme ultraviolet soft x-ray radiation and said Ti doped high purity $SiO_2$ glass has a coefficient of thermal expansion for said raised temperature range that is less than 10 ppb and greater than −10 ppb and has a variation ≦10 ppb.

30. A method as claimed in claim 28, wherein providing a Ti doped high purity $SiO_2$ glass substrate further includes, providing a high purity Si containing feedstock and a high purity Ti containing feedstock, delivering said high purity Si containing feedstock and said high purity Ti containing feedstock to a conversion site, converting said Si containing feedstock and said Ti containing feedstock into Ti doped $SiO_2$ soot, consolidating said Ti doped $SiO_2$ soot into an inclusion fee homogeneous Ti doped high purity $SiO_2$ glass, forming said glass into a Ti doped high purity $SiO_2$ glass substrate.

31. A method as claimed in claim 30, wherein providing a high purity Si containing feedstock and a high purity Ti containing feedstock includes providing a chlorine-free high purity Si containing feedstock and providing a chlorine-free high purity Ti containing feedstock, converting said chlorine-free feedstocks into chlorine-free Ti doped $SiO_2$ soot, and consolidating said soot into a chlorine-free Ti doped $SiO_2$ glass.

32. A method as claimed in claim 28, wherein said glass substrate has a Ti dopant weight percent level and providing a Ti doped high purity $SiO_2$ glass substrate further includes adjusting said Ti dopant weight percent level so that said glass substrate has a coefficient of thermal expansion centered about 0 at an operating temperature of said mask.

33. A reflective extreme ultraviolet soft x-ray lithography element comprising:

a Ti doped high purity $SiO_2$ inclusion-free glass having an unetched polished radiation manipulating shaped surface with the surface free of printable surface figure defects that a have a surface figure measurement >0.25 nm rms, said surface having a mid-spatial frequency roughness <0.20 nm rms, and a high-spatial frequency roughness <0.10 nm rms.

34. A lithography element as claimed in claim 33 wherein said glass consists of silicon, titanium, and oxygen.

35. A lithography element as claimed in claim 33 wherein said glass contains from 5 to 10 wt. % $TiO_2$ and has a coefficient of thermal expansion in the [rage] *range* from +10 ppb to −10 ppb at 20° C.

36. A lithography element as claimed in claim 33 wherein said glass is crystal-free.

37. A lithography element as claimed in claim 33 wherein said glass is free of chlorine.

38. A lithography element as claimed in claim 33 wherein said glass has an impurity level of less than 10 ppm of alkali and alkaline earth metals and said Ti dopant is homogeneously distributed in said glass.

39. A method of making a reflective extreme ultraviolet soft x-ray lithography element said method comprising:

providing a high purity Si containing feedstock and a high purity Ti containing feedstock, delivering said high purity Si containing feedstock and said high purity Ti containing feedstock to a conversion site, converting said Si containing feedstock and said Ti containing feedstock into Ti doped $SiO_2$ soot, consolidating said Ti doped $SiO_2$ soot into an inclusion free homogeneous Ti doped high purity $SiO_2$ glass, forming glass into a Ti doped high purity $SiO_2$ glass preform.

40. A method as claimed in claim 39 further comprising forming said preform into a shaped surface lithography element substrate, measuring a figure and finish of said substrate surface, and coating the substrate surface with an extreme ultraviolet soft x-ray reflective coating.

41. A method as claimed in claim 39, wherein providing a high purity Si containing feedstock includes providing a chlorine-free high purity Si containing feedstock and providing a chlorine-free high purity Ti containing feedstock, converting said chlorine-free feedstocks into chlorine-free Ti doped $SiO_2$ soot, and consolidating said soot into chlorine-free Ti doped $SiO_2$ glass.

42. A method as claimed in claim 39, wherein said glass preform has a Ti dopant weight percent level and providing a Ti doped $SiO_2$ glass preform further includes adjusting said Ti dopant weight percent level so that said preform has a coefficient of thermal expansion centered about 0 at an operating temperature of said lithography element.

43. A method as claimed in claim 39, wherein said glass preform consists of silicon, titanium, and oxygen.

*44. A reflective extreme ultraviolet soft x-ray lithography element comprising:*

*a Ti doped high purity $SiO_2$ inclusion-free glass having a polished radiation manipulating shaped surface with the surface free of printable surface figure defects that have a surface figure measurement >0.25 nm rms, said surface having a mid-spatial frequency roughness <0.20 nm rms, and a high-spatial frequency roughness <0.10 nm rms.*

*45. A lithography element as claimed in claim 44 wherein said glass consists of silicon, titanium, and oxygen.*

*46. A lithography element as claimed in claim 44 wherein said glass contains from 5 to 10 wt. % $TiO_2$ and has a coefficient of thermal expansion in the range from +10 ppb to −10 ppb at 20° C.*

*47. A lithography element as claimed in claim 44 wherein said glass is crystal-free.*

*48. A lithography element as claimed in claim 44 wherein said glass is free of chlorine.*

*49. A lithography element as claimed in claim 44 wherein said glass has an impurity level of less than 10 ppm of alkali and alkaline earth metals and said Ti dopant is homogeneously distributed in said glass.*

* * * * *